US008285502B2

(12) United States Patent
Kenly et al.

(10) Patent No.: US 8,285,502 B2
(45) Date of Patent: Oct. 9, 2012

(54) DIGITAL COMPENSATOR FOR POWER SUPPLY APPLICATIONS

(75) Inventors: Stewart Kenly, Epping, NH (US); Paul W. Latham, II, Lee, NH (US)

(73) Assignee: L&L Engineering, LLC, Lee, NH (US)

( * ) Notice: Subject to any disclaimer, the term of this patent is extended or adjusted under 35 U.S.C. 154(b) by 358 days.

(21) Appl. No.: 12/622,478

(22) Filed: Nov. 20, 2009

(65) Prior Publication Data

US 2010/0131219 A1 May 27, 2010

Related U.S. Application Data

(60) Provisional application No. 61/116,874, filed on Nov. 21, 2008.

(51) Int. Cl.
*G01R 19/00* (2006.01)
(52) U.S. Cl. ............. 702/64; 702/66; 702/108; 702/127
(58) Field of Classification Search ............... 702/64, 702/66, 108, 127; 363/41, 39, 95; 324/654; 323/207, 222, 205; 307/103, 104
See application file for complete search history.

(56) References Cited

U.S. PATENT DOCUMENTS

| | | | |
|---|---|---|---|
| 6,020,729 A | 2/2000 | Stratakos et al. | |
| 6,400,579 B2 * | 6/2002 | Cuk | ................................. 363/16 |
| 6,979,987 B2 | 12/2005 | Kernahan et al. | |
| 7,106,035 B2 | 9/2006 | Xing | |
| 7,295,645 B1 | 11/2007 | El-Ghoroury et al. | |
| 2006/0055574 A1 | 3/2006 | Maksimovic et al. | |
| 2007/0070660 A1 | 3/2007 | Tallam | |
| 2007/0108951 A1 | 5/2007 | Coleman | |
| 2007/0114985 A1 | 5/2007 | Latham et al. | |
| 2008/0084200 A1 * | 4/2008 | Kojori | ....................... 324/117 H |
| 2008/0303501 A1 | 12/2008 | Prodic | |
| 2009/0267580 A1 | 10/2009 | Derksen | |

FOREIGN PATENT DOCUMENTS

EP   1524569 B1   9/2008

(Continued)

OTHER PUBLICATIONS

Buiatti, G.M. et al., Parameter Estimation of a DC/DC Buck converter using a continuous time model, 2007 European Conference on Power Electronics and Applications, Date: Sep. 2-5, 2007, pp. 1-8.

(Continued)

*Primary Examiner* — Michael Nghiem
*Assistant Examiner* — Elias Desta

(57) ABSTRACT

An inductor current estimator for a switching power supply includes a first sensing and averaging component that generates an average of a switch voltage and a second sensing and averaging component that generates an average of an output voltage of the switching power supply. A first subtraction component receives the average of the switch voltage and the average of the output voltage. A first multiplying component receives an output of the first subtraction component and multiplies the output of the first subtraction component by a first model parameter. A second multiplying component multiplies an input to the second multiplying component by a second model parameter. An adding component adds an output of the first multiplying component and an output of the second multiplying component. A delay component receives an output of the adding component and provides an output to an input of the second multiplying component.

17 Claims, 20 Drawing Sheets

FOREIGN PATENT DOCUMENTS

WO 2007015182 A2 2/2007

OTHER PUBLICATIONS

Lukic, Z. et al., Self-tuning digital current estimator for low-power switching converters, APEC 2008. Twenty-Third Annual IEEE Applied Power Electronics Conference and Exposition, 2008, Date: Feb. 24-28, 2008, pp. 529-534.

Hsieh, J. et al., Parameter estimation algorithm for performance fine tuning of switching DC power supplies, 22nd Annual IEEE Power Electronics Specialists Conference, 1991, PESC '91 Record., Date: Jun. 24-27, 1991, pp. 51-56.

Emadi, A. et al., Real time state estimation of multi-converter DC power electronic systems using generalized state space averaging method, 2002 IEEE 33rd Annual Power Electronics Specialists Conference, 2002, vol. 2, Date: 2002, pp. 881-886.

Mattavelli, P., Digital control of DC-DC boost converters with inductor current estimation, APEC '04, Nineteenth Annual Applied Power Electronics Conference and Exposition, 2004, vol. 1, Date: 2004, pp. 74-80 vol. 1.

Kelly, A. et al., A self-compensating adaptive digital regulator for switching converters based on linear prediction, APEC '06, Twenty-First Annual Applied Power Electronics Conference and Exposition, 2006, Date: Mar. 19-23, 2006, pp. 712-718.

Meola et al., Digital PFM controller with adaptive on time based on load current estimation, Power Electronics Specialists Conference, 2008. PESC 2008. IEEE, Date: Jun. 15-19, 2008, pp. 3695-3700.

Watts, D., Practical averaging circuits, IEEE Transactions on Automatic Control, vol. 10, Issue 3, Date: Jul. 1965, pp. 363-364.

Sanders, S.R. et al., Generalized averaging method for power conversion circuits, IEEE Transactions on Power Electronics, vol. 6, Issue 2, Date: Apr. 1991, pp. 251-259.

Stefanutti, W. et al. Reduction of Quantization Effects in Digitally Controlled dc-dc Converters using Inductor Current Estimation.

International Search Report and Written Opinion dtd. Jan. 21, 2010 for PCT/US09/65260.

* cited by examiner

DIGITAL COMPENSATOR FOR POWER SUPPLY APPLICATIONS

CROSS REFERENCE TO RELATED APPLICATIONS

The present application claims priority to U.S. Provisional Application No. 61/116,874 filed Nov. 21, 2008 entitled DIGITAL COMPENSATOR FOR POWER SUPPLY APPLICATIONS, which is incorporated herein in its entirety by reference.

BACKGROUND

These teachings relates generally to control of power supplies and similar devices.

Power supplies and in particular buck regulators are an important parts of today's technology. These devices consist of mainly two main parts, the power electronics and the controller. The controller functions to operate the power electronics in a manner that satisfies the system requirements of the load. Both the power electronics section and the controller need to be designed to meet the demanding objectives of the electrical specifications and cost. Due to the reduction in cost of digital electronics as popularized by Moore's law, a recent trend is the use of digital electronics for the controller.

Key desired features of an effective controller are: fast settling time, low DC error, adjustable output impedance, current limit, and stability.

There is a need for a high performance digital compensator controller with the above listed desired features.

Digital compensators are typically implemented as a PID or PID with additional filtering. These are typically digital implementations of older analog designs.

There are three common methods used for current sensing. The first method measures the voltage drop across one or more of the power FETs and uses the on resistance of power FET to calculate inductor current. This method has significant limitations. First, the on resistance of the power FET has a large tolerance and as temperature dependence. Second voltage across the FETs are very small and is difficult to measure accurately.

FIG. 2 illustrates the second method of a sense resistor in series with the inductor. The voltage across sense resistor is measured and the current is then determined. The limitation with this method is the requirement for an external power resistor in series with the inductor. This resistor lowers the supply efficiency and increases cost. To improve efficiency, the resistor value can be lowered, but this complicates measurements due to noise.

As shown in FIG. 3, the third method uses an external RC network to model the inductor and its series equivalent resistance, Rdc. One difficulty of this method is that the series resistance of the inductor is temperature dependent and may be unknown. In addition, other practical limitations occur due to the fast switching of the FET outputs and its noise.

All of the above methods suffer from noise sensitivity and, in two of the cases, parameter uncertainty. Also, what is desired for compensation is not the actual inductor current but the inductor current average over one PWM cycle. In continuous conduction, inductor current has a triangular like waveform due to the pulse width modulated drive signal from the power FETs. None of these methods provide the actual average inductor current.

There is a need for a method that reduces component cost, reduces noise sensitivity, is parametric stable and provides the average inductor current over one PWM cycle.

BRIEF SUMMARY

In one embodiment, the system of these teachings includes a mixed signal state estimator, and average inductor current estimator, and duty cycle calculation. In one instance, the average inductor estimator includes utilizing the average switch voltage and the average output voltage to obtain the estimate of the average inductor current. In another instance, measurements are utilized to adjust the estimate. In one embodiment in which measurements are utilized to adjust the estimate, low pass filters with predetermined pole locations are used to correct aliasing problems.

In one embodiment, the mixed-signal state estimator includes both a high dynamic range DAC and a low dynamic range ADC. Other embodiments of the mixed-signal state estimator and also disclosed.

Embodiments of the duty cycle calculation are also disclosed.

For a better understanding of the present teachings, together with other and further needs thereof, reference is made to the accompanying drawings and detailed description and its scope will be pointed out in the appended claims.

DETAILED DESCRIPTION

Figure 1:
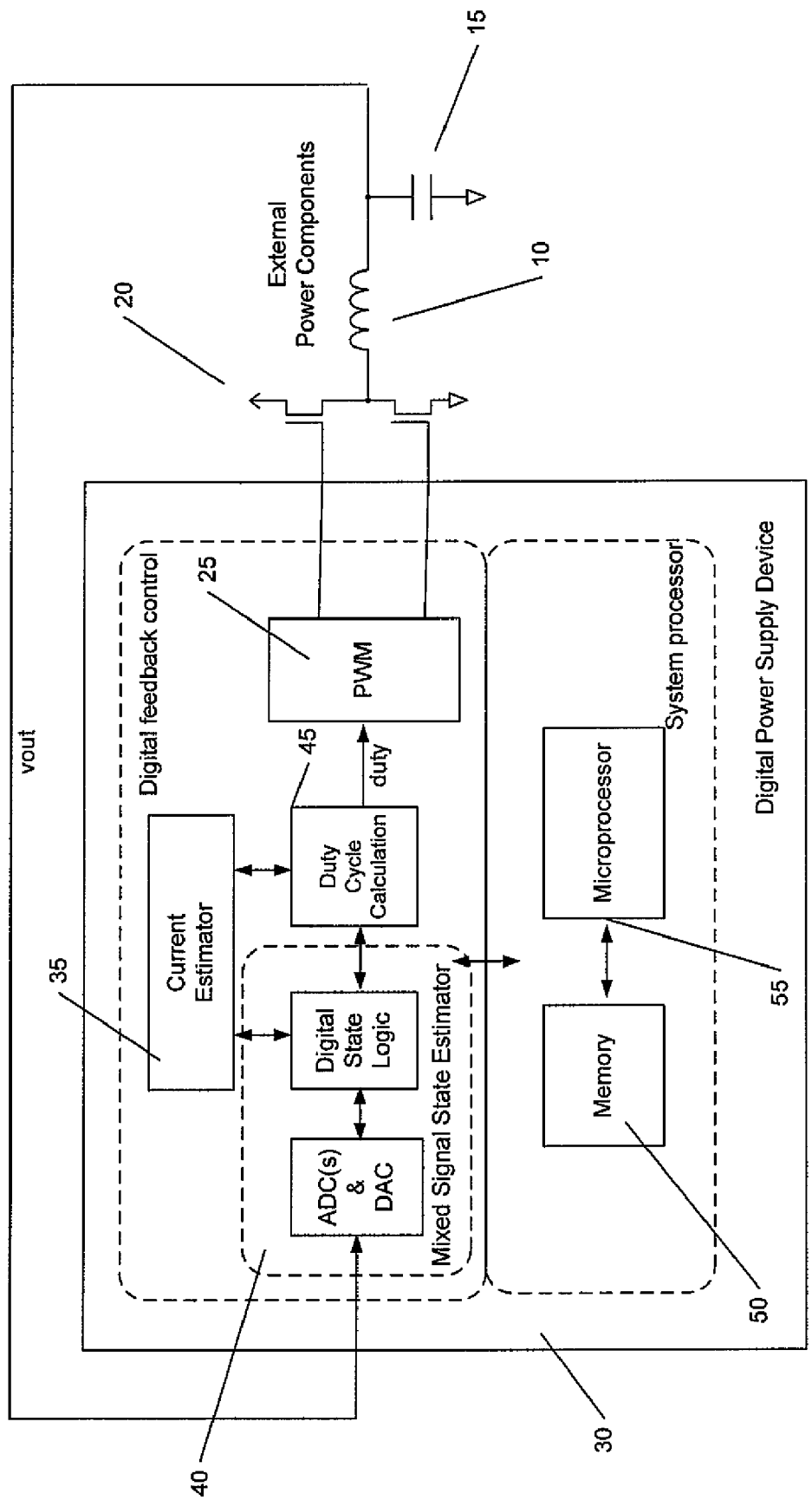
FIG. 1 shows a block diagram of an embodiment of the present teachings.
Figure 2:
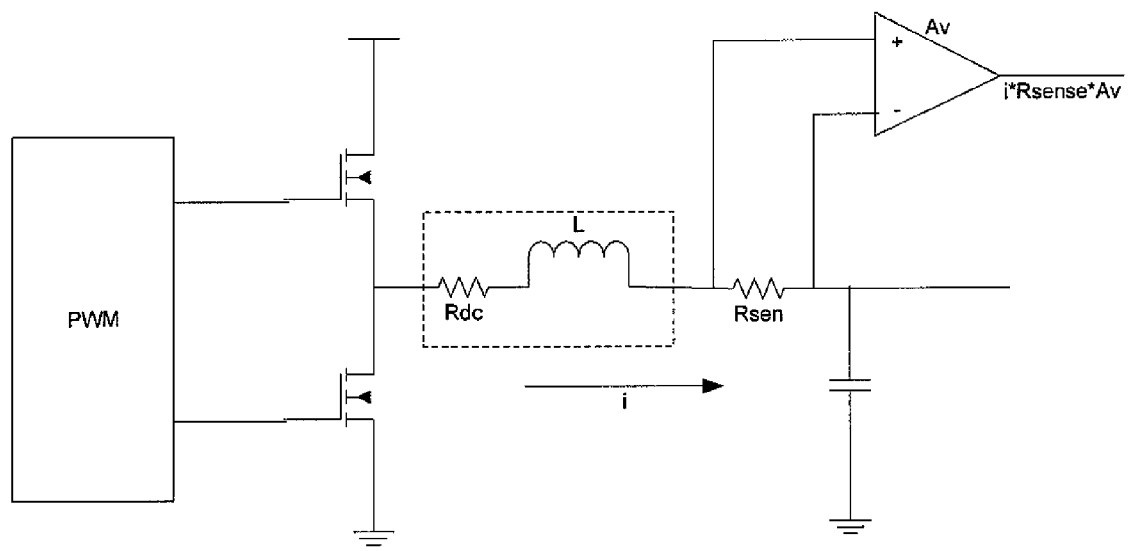
FIG. 2 illustrates a conventional method for current sensing.
Figure 3:
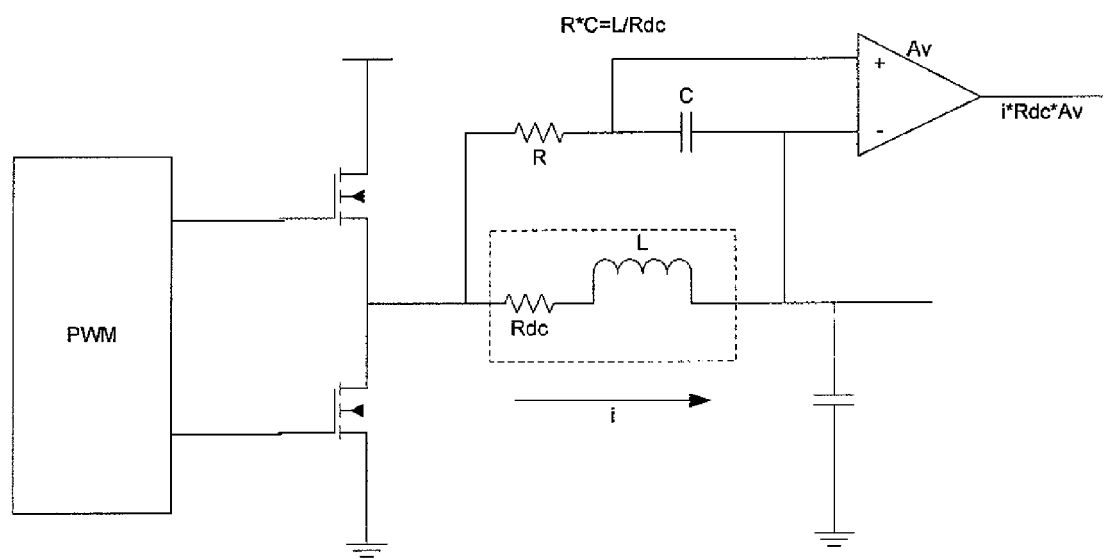
FIG. 3 illustrates another conventional method for current sensing.

FIG. 1 shows a block diagram of an embodiment of the present teachings. This embodiment includes a mixed signal state estimator, inductor current estimator, and duty cycle calculation. Referring to FIG. 1, shown therein is a switching power supply including a circuit having two or more reactive components 10, 15 configured to provide output voltage, where one of the two or more reactive components is an inductor, a switching component 20 switching the circuit between two or more switching states, the two are more switching states including one output state and another voltage state, a pulse width modulator 25 and a controller 30. The pulse width modulator 25 receives the duty cycle and dives the switching component 20 in order to cause switching between two of the two or more switching states. The controller 30 includes an inductor current estimator 35 providing an inductor current estimate, where inductor current is not measured directly, a state estimator 40 receiving the inductor current estimate on providing an estimate of the system states, where the state estimator includes both analog and digital components (also referred to as a mixed signal state estimator) and a duty cycle determination component 45 (also referred to as a duty cycle calculation component) receiving the estimate of the system states and the inductor current estimate and providing a duty cycle to the pulse width modulator 25. Also shown in FIG. 1, is a computer usable medium 50 having computer readable code that causes the processor 55 to execute operations needed in the performance of the functions of the current estimators 35, the mixed-signal state estimator 40 and the duty cycle calculation 45.

The embodiment shown in FIG. 1 uses a buck converter topology. However the methods of these teachings are applicable to any generic converter of buck, boost, or buck-boost, forward, fly-back, SEPIC, cuk, etc type.

As shown in FIG. 1, the embodiment shown therein is the combination of the three parts working together to achieve the desired digital compensator. These parts are: average inductor current estimator, mixed signal state estimator and duty cycle calculator.

Average Inductor Current Estimator

In one embodiment of the average inductor current estimator, the average switch voltage combined with the average voltage across the inductor are utilized to obtain the average inductor current. In the typical digital power supply application, the output voltage and supply voltage are digitized by analog to digital converters.

Figure 4A:
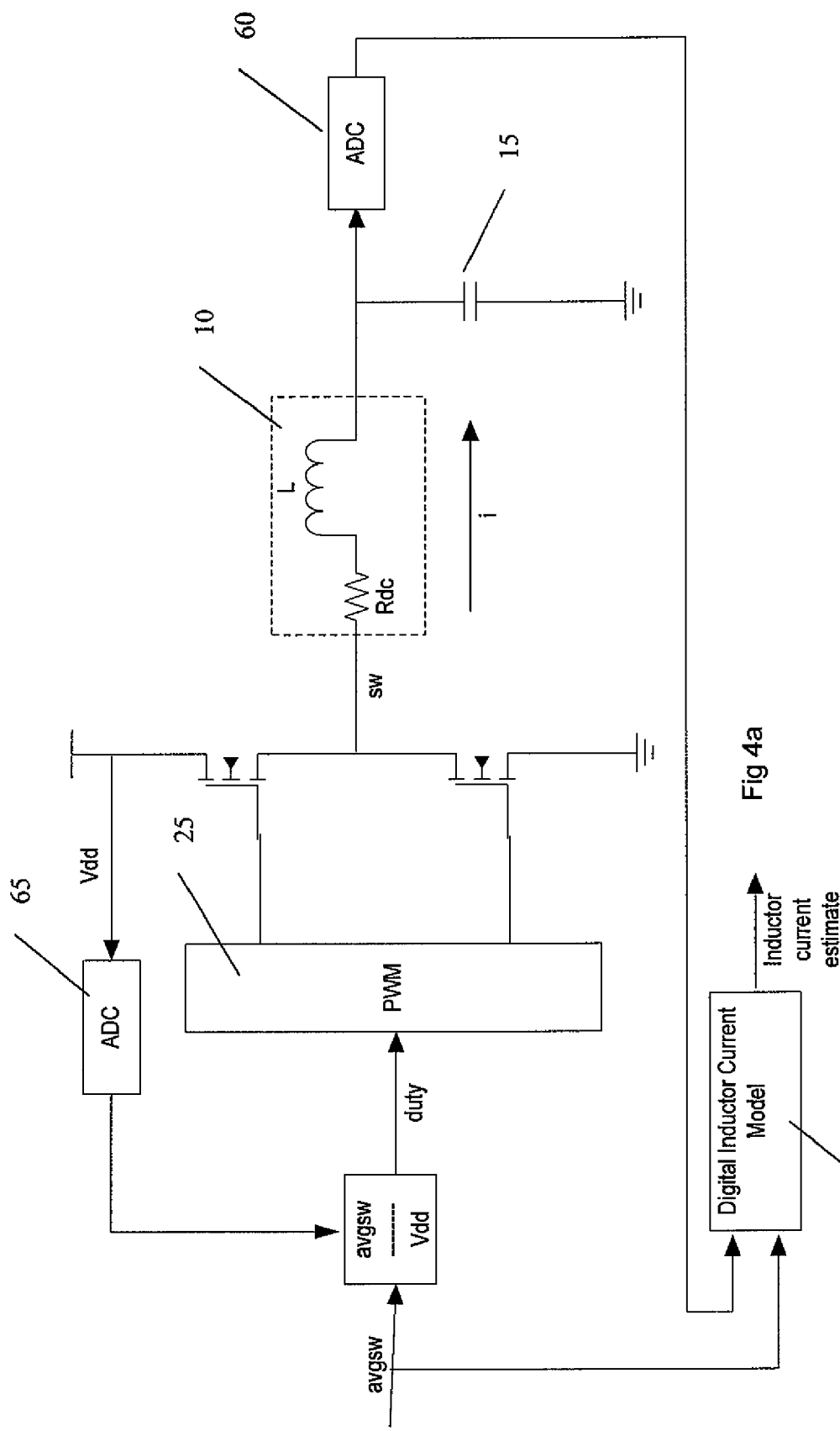
FIGS. 4a, 4b are schematic diagrams of a system of these teachings including an embodiment of a current estimator of these teachings.
Figure 4B:
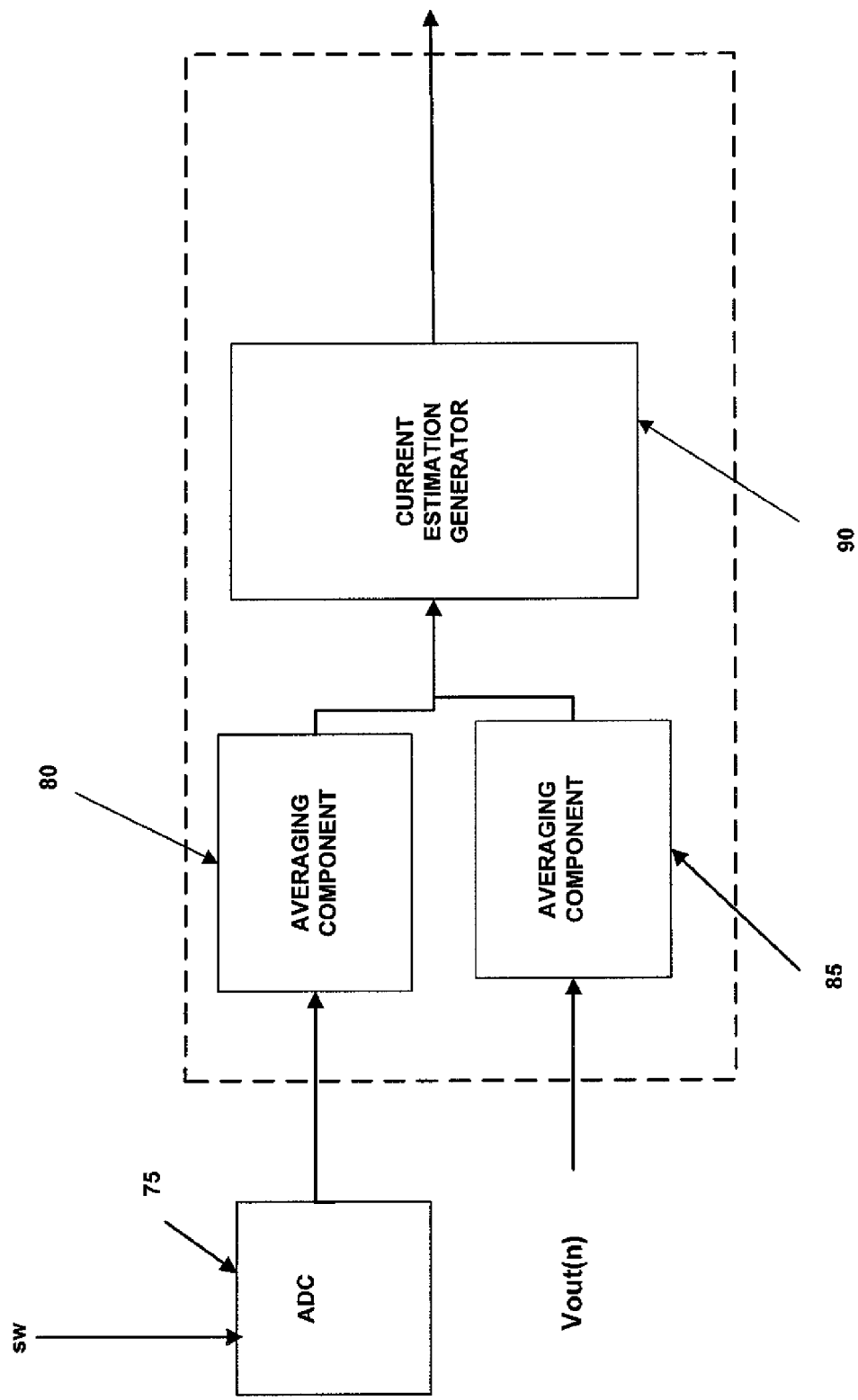

One embodiment of a switching power supply including an inductor current predictor component is shown in FIGS. 4a and 4b (other components of the controller are not shown). Referring to FIG. 4a, an analog to digital converter (ADC) 60 digitizes the output voltage across the capacitor 15. The digitized output voltages provided to the inductor current predictor component 70. Another ADC 65 is shown digitizing the input voltage Vdd. Average values of the output voltage and the switch voltage (sw) can be obtained by conventional means for a running average $$\left(\frac{1}{N}\sum_{j=i}^{j=i+N} x_j\right).$$

(In other embodiments, analog circuits can be used for averaging before the ADC or other conventional definitions of a running average can be used. See, for example, Watts, D., Practical averaging circuits, IEEE Transactions on Automatic Control, Volume 10, Issue 3, Date: July 1965, Pages: 363-364, for analog means, and Sanders, S. R.; Noworolski, J. M.; Liu, X. Z.; Verghese, G. C., Generalized averaging method for power conversion circuits, IEEE Transactions on Power Electronics, Volume 6, Issue 2, Date: April 1991, Pages: 251-259, for other discrete implementation approaches, both of which are incorporated by reference herein in their entirety.) Referring to FIG. 4b, in which a more detailed embodiments of the inductor current predictor is shown, the switch voltage is digitized by an ADC 75. (In other embodiments, the average switch voltage can be obtained recursively. That is, once the duty cycle calculation is performed, the average switch voltage is given by the input voltage-Vdd-multiplied by the duty cycle. In those embodiments, the ADC 75 and the averaging component 80 in FIG. 4b are omitted.) The digitized switch voltage (in embodiments where the average switch voltage is measured) and the digitized output voltage are provided to two averaging components 80, 85 (it should be noted that the averaging components could be implemented using computer usable memory 50 and processor 55 in FIG. 1). The averaged switch voltage and the averaged output voltage are provided to an inductor current estimate generator 90, which provides the inductor current estimate.

The derivation of the average inductor current model is as follows:

The equation for the instantaneous inductor current is:

$$L\frac{di(t)}{dt} = sw(t) - Ri(t) - vout(t)$$

When averaged over a PWM cycle, this reduces to:

$$L\frac{1}{T}\frac{d}{dt}\int_0^T i(t)dt = \frac{1}{T}\int_0^T sw(t)dt - R\frac{1}{T}\int_0^T i(t)dt - \frac{1}{T}\int_0^T vout(t)dt$$

Using the definition of averaging over one period, this simplifies to:

$$L\frac{davgi(t)}{dt} = avgsw(t) - Ravgi(t) - vest(t)$$

where:
avgi is the average inductor current
avgsw is the average switch voltage
vest Is the average output voltage as measured or estimated
L, R are the inductor inductance and power stage DC resistance These differential equations may be simplified to a discreet time equation of the form:

avgi(n+1)=Aext avgi(n)+Bext(avgsw(n)−vest(n))

where Aext and Bext may be computed using standard zero order hold discrete time approximations. For example, but not limited to, the c2d( ) function in Mathworks Matlab. Other approximations can be obtained using the methods outlined in Franklin and Powell (Franklin, Powell, Workman, Digital Control of Dynamic Systems, chapter 6, ISBN 0-201-8204-4) or other conventional methods.

In many instances, the L/R time constant of the inductor is much longer than the sample rate. In this case Aest & Best can be approximated by:

Best=T/L

Aest=1−RT/L

Figure 5:
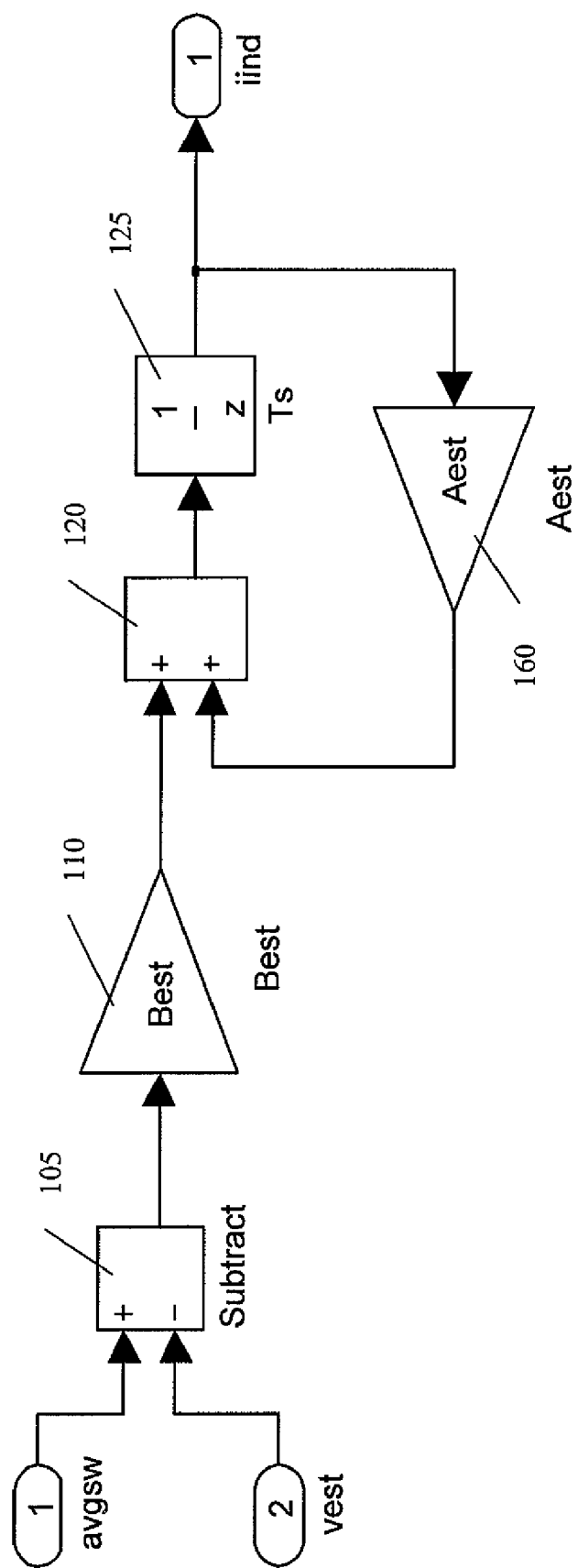
FIG. 5 represents a block diagram for an embodiment of a current estimator of these teachings.

The block diagram for an embodiment of the current estimator is shown in FIG. 5. Referring to FIG. 5, the current estimator shown therein includes a subtraction component 105 receiving the average of the switch voltage and the average of the output voltage, a first multiplying component 110 receiving an output of the subtraction component and multiplying the output of the subtraction component by a first model parameter, a second multiplying component 160 multiplying an input to the second multiplier component by a second model parameter, an adding component 120 receiving an output of the first multiplying component and an output of the second multiplying component and a delay component 125 receiving an output of the adding component, an input to the second multiplier 160 being an output of the delay component 125.

Combined Method

Sometimes the inductor model is not accurately known. In this case it is necessary to optimize or adapt the inductor model to match measurements. To achieve this, measurements of the inductor current are utilized. In the method of these teachings, inductor voltage is measured rather than inductor current, which is a measured quantity in the conventional methods.

Figure 6A:
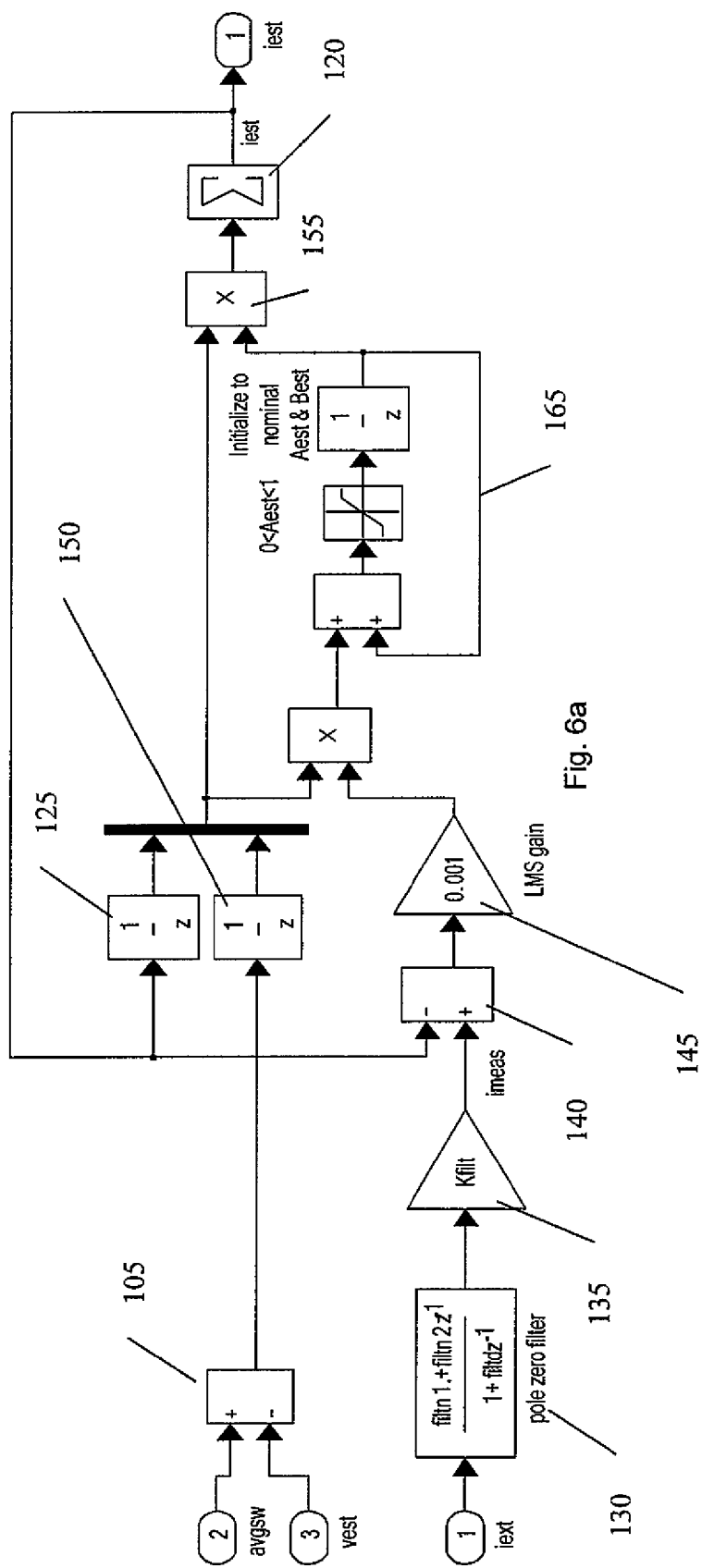
FIGS. 6a, 6b represent a block diagram for another embodiment of the current estimator of these teachings.
Figure 6B:
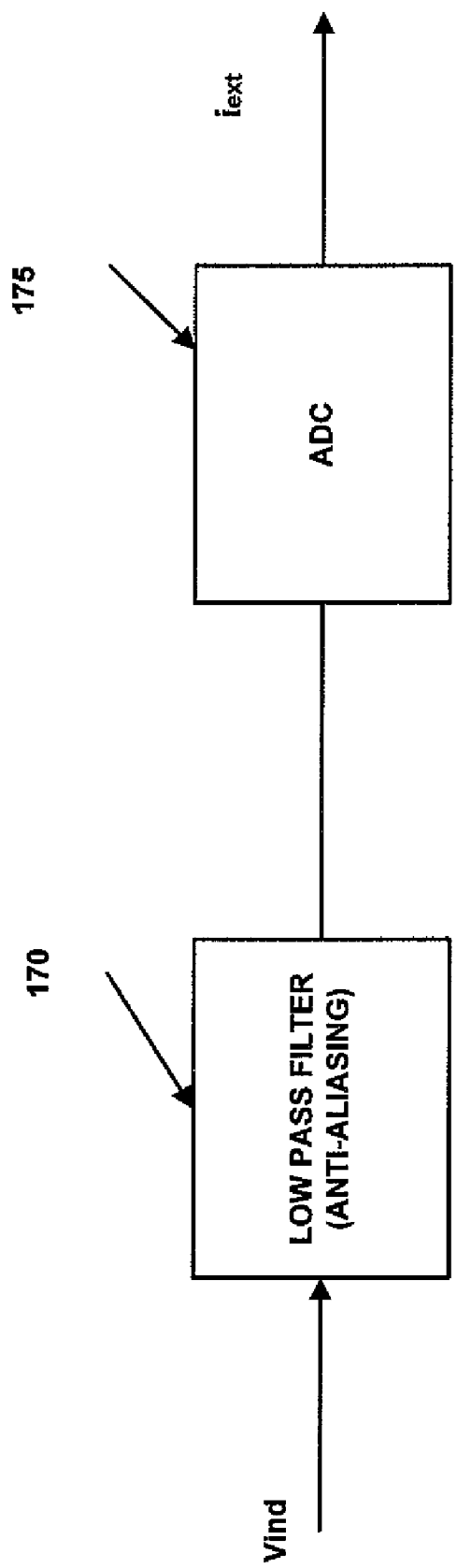

Referring to FIGS. 6a and 6b, the external (measured) inductor voltage is filtered by a simple low-pass filter 170 with a known pole to correct for aliasing problems. The resulting filtered voltage is digitized by an ADC 175 and filtered by a pole and zero digital filter 130. The zero is adjusted to compensate for the external anti-aliasing filter and the pole is adjusted to match inductor time constant. The DC gain of the filter is adjusted to compensate for the temperature dependents of the inductor DC resistance. The output of the pole-zero filter 130, after multiplying by the filter gain (using multiplier 135) is the measured inductor current.

This external current measurement is compared against the internal current estimate and adjustments to the model coefficients (Aest, Best) to match each other and minimize the internal current estimations error. The combination method provides for the excellent noise performance of the internal model with the DC accuracy of the external model. One method for implementing these adjustments is the LMS algorithm. This adjustment strategy can be seen in FIG. 6a. Referring to FIG. 6a, a comparison component 140 compares the predicted inductor current and the measured inductor current and an adjustment component 145, 165 receives an output of the comparison component 140 and providing adjusted values for parameters of the discrete time representation of the circuit equation for inductor current. The estimated inductor current is obtained by subtracting, utilizing a subtraction component 105, the average of the switch voltage and the average of the output voltage. Adjusted values of a first and second model parameters are obtained from the adjustment component 145, 165. The predicted inductor current is obtained by a sum (obtained from adding component 120) of a product (obtained from multiplying component 155) of the first model parameter (after adjustment) times an output of the subtraction component plus a product of the second model parameter (after adjustment) and a delayed value (obtained from delay component 125) of a previously predicted inductor current. (Delay component 150 is utilized the adjustment process.) In the embodiment shown in FIG. 6a, the adjustments are performed utilizing the LMS method and the difference between the estimated and measured inductor current is multiplied by an LMS gain (by a multiplier 145).

Figure 7:
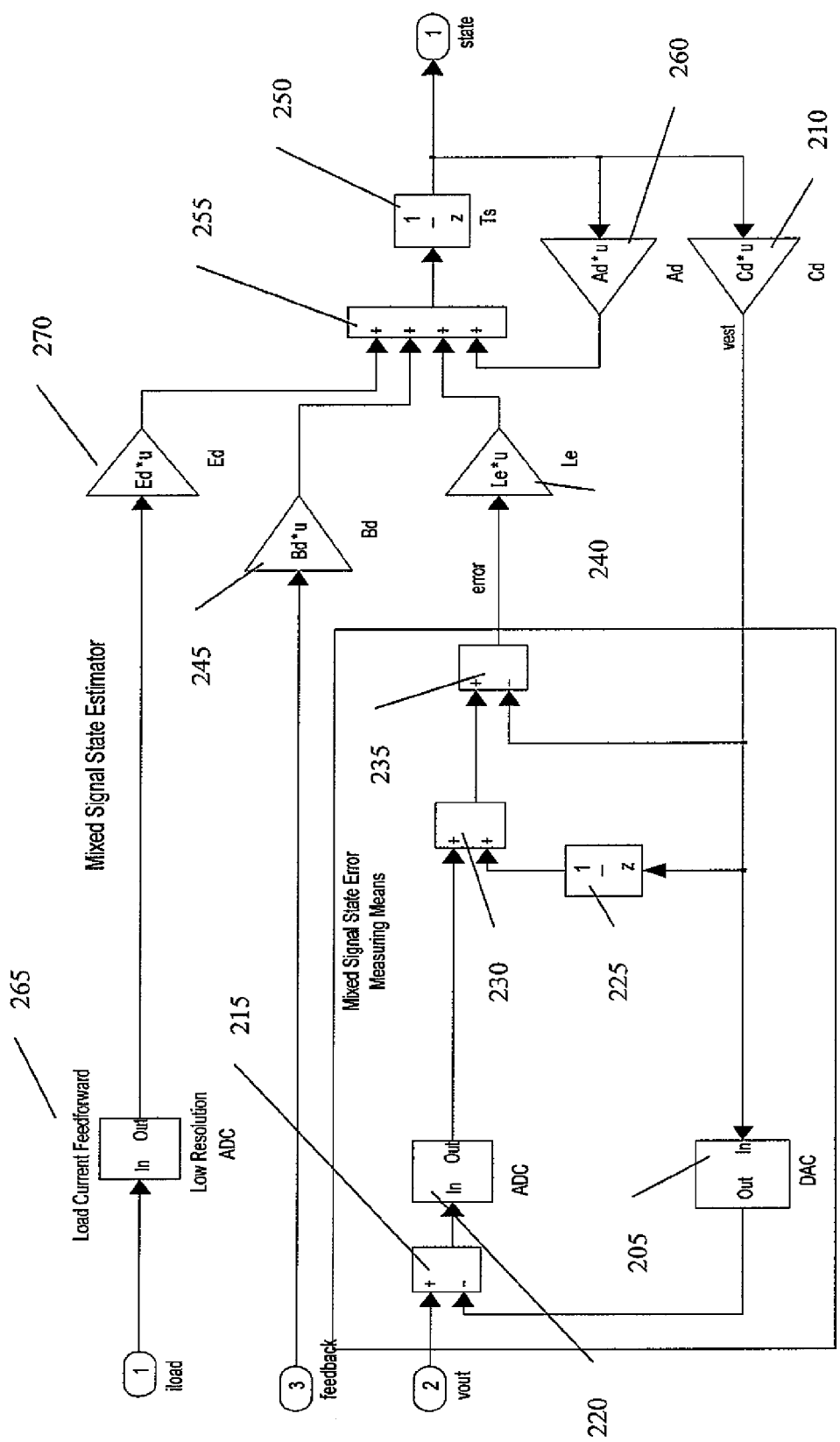
FIG. 7 represents a block diagram for yet another embodiment of the current estimator of these teachings.

The equations for the combined method are:

$$\text{imeas}(n+1)=\text{Kfilt}(\text{filt}n1\text{iext}(n+1)+\text{filt}n2\text{iext}(n)-\text{filtd imeas}(n))$$

$$\text{iest}(n+1)=\text{Aest}(n)\text{iest}(n)+\text{Best}(n)(\text{avgsw}(n)-\text{vest}(n))$$

$$\text{Aest}(n+1)=\text{Aest}(n)+\text{LMSgain}(\text{imeas}(n+1)-\text{iest}(n+1))$$

$$\text{Best}(n+1)=\text{Best}(n)+\text{LMSgain}(\text{imeas}(n+1)\text{iest}(n+1))$$

where:
  Kfilt is the external sense gain
  filtn1, filtn2, filtd are pole zero filter gains
  Aest, Best are current model parameters
  LMSgain is the LMS algorithm adaptation gain
  iext in the ADC output from the inductor voltage anti-aliasing filter
  imeas is the measured inductor current
  iest is the estimated inductor current Mixed Signal State Estimator The mixed signal state estimator allows high accuracy estimation of plant (external component) state variables with a low performance ADC. Classic (conventional) designs use an ADC to measure the plant outputs and implement the state estimator in either logic or software. This method requires an ADC with both high dynamic range and high resolution. The mixed signal estimator uses a high dynamic range DAC and a low dynamic range ADC. The ADC digitizes only the output error which has significantly lower dynamic range. This saves both cost & power. FIG. 7 shows the mixed signal estimator with load current feedforward added. Referring to FIG. 7, the embodiment shown therein includes a high dynamic range digital to analog converter (DAC) 205 receiving an estimated output voltage, the estimated output voltage being obtained by multiplying, utilizing multiplier 210, an estimated state vector by an output matrix. An analog subtraction component 215 subtracts an output of the high dynamic range DAC 205 from a measured output voltage. A first delay component 225 receives the estimated output voltage and an addition component 230 receives an output of the ADC 220 and an output of the first delay component 225. A subtraction component 235 receives an output of the addition component 230 and the estimated output voltage; an output of the subtraction component is the voltage error, the voltage error being utilized in obtaining the estimated state vector. A first multiplier 240 receives the voltage error and multiplies the voltage error by an output error feedback matrix. A second multiplier 245 receives a predetermined/previously obtained feedback signal and multiplies the feedback signal by an input matrix. A third multiplier 260 receives an output of a second delay component 250. Another addition component 255 receives outputs of the first, second and third multiplier and provides a sum of received quantities. The sum of the received quantities is provided to the second delay component 250 and represents the estimated state. In one embodiment, also shown in FIG. 7, the state estimator also includes load current feedforward. In the embodiment including load current feedforward, the state estimator also includes a low resolution ADC 265 receiving a load current signal, a fourth multiplier 270 receiving an output of the low resolution ADC 265, the fourth multiplier 270 multiplies the output of the low resolution ADC 265 by a feedforward matrix. An output of the fourth multiplier 270 is received by the other addition component 255.

The Equations for the embodiment shown in FIG. 7 are:

$$\text{state}(n+1)=\text{Ad state}(n)+\text{Bd feedback}(n)+\text{Ed iload}(n)+\text{Le error}(n)$$

$$\text{error}(n)=\text{vout}(n)-\text{Cd state}(n)$$

where:
  Ad is state transition matrix
  Bd is input matrix
  Cd is output matrix
  Ed is the optional feedforward matrix
  Le is output error feedback matrix
(It should be noted that, in the above equation, the terms state transition matrix, input matrix, output matrix, output error feedback matrix and feedforward matrix are used in the sense of "modern"-circa 1960-control theory.

Mixed Signal:

$$adc(n)=vout(nTs)-dac(nTs)$$

Subtraction is done in the analog domain $$dac(nTs)=Cd\ state(n-1)$$

DAC has a one sample delay to allow for settling $$error(n)=adc(n)-Cd\ state(n)+Cd\ state(n-1)$$

The error term has correction for single cycle DAC delay. This lower DAC/ADC requirements.

Figure 8:
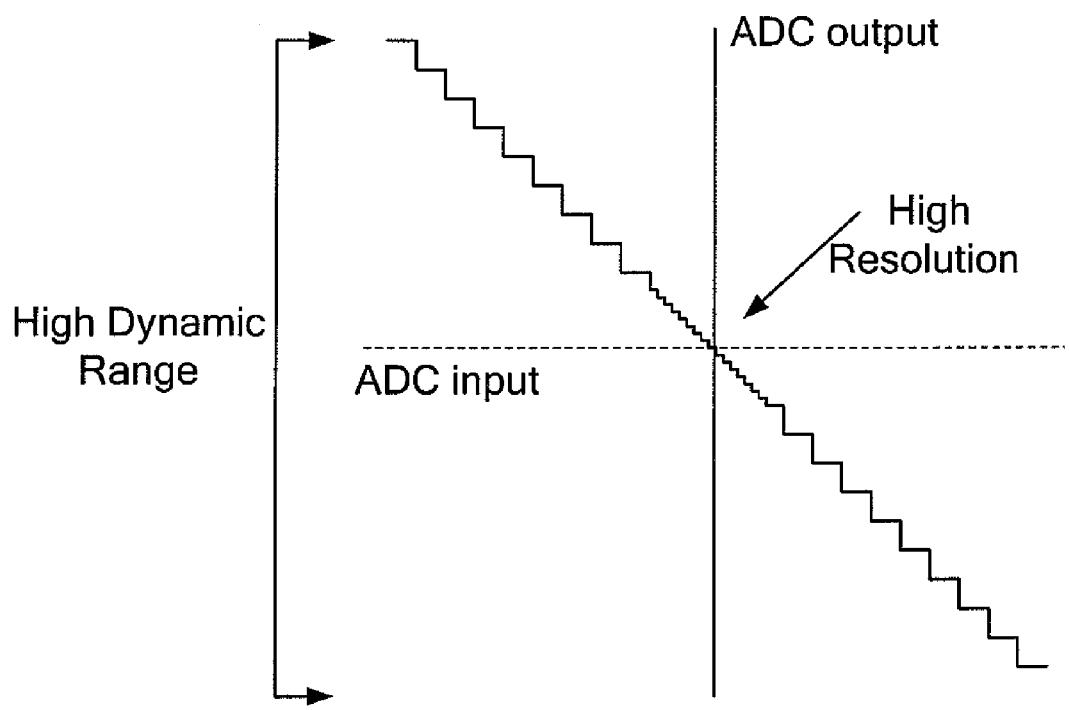
FIG. 8 is a schematic graphical representation of a multi-resolution ADC.

For low estimation error, the requirements for the ADC are high resolution and low offset. The gain is less critical. The DAC has to have a dynamic range that is larger then the output voltage range. This allows the state estimator to follow any output voltage and, thus, allow for closed loop operation. This is an advantage for start up, shut down, and current limit. If the control loop dynamics are not demanding, the estimator bandwidth may be lowered. This in turn lowers the resolution requirement. In the case where the estimator sampling rate is very high and the output voltage feedback loop is slow, the ADC can be only 1 bit, a comparator. When the estimator has to be very fast and the control disturbances are very large, such as in the case of point of load regulators, a multi-resolution ADC can be used. This ADC increases the dynamic range while providing low error. FIG. 8 shows the multi-resolution ADC concept.

Figure 9:
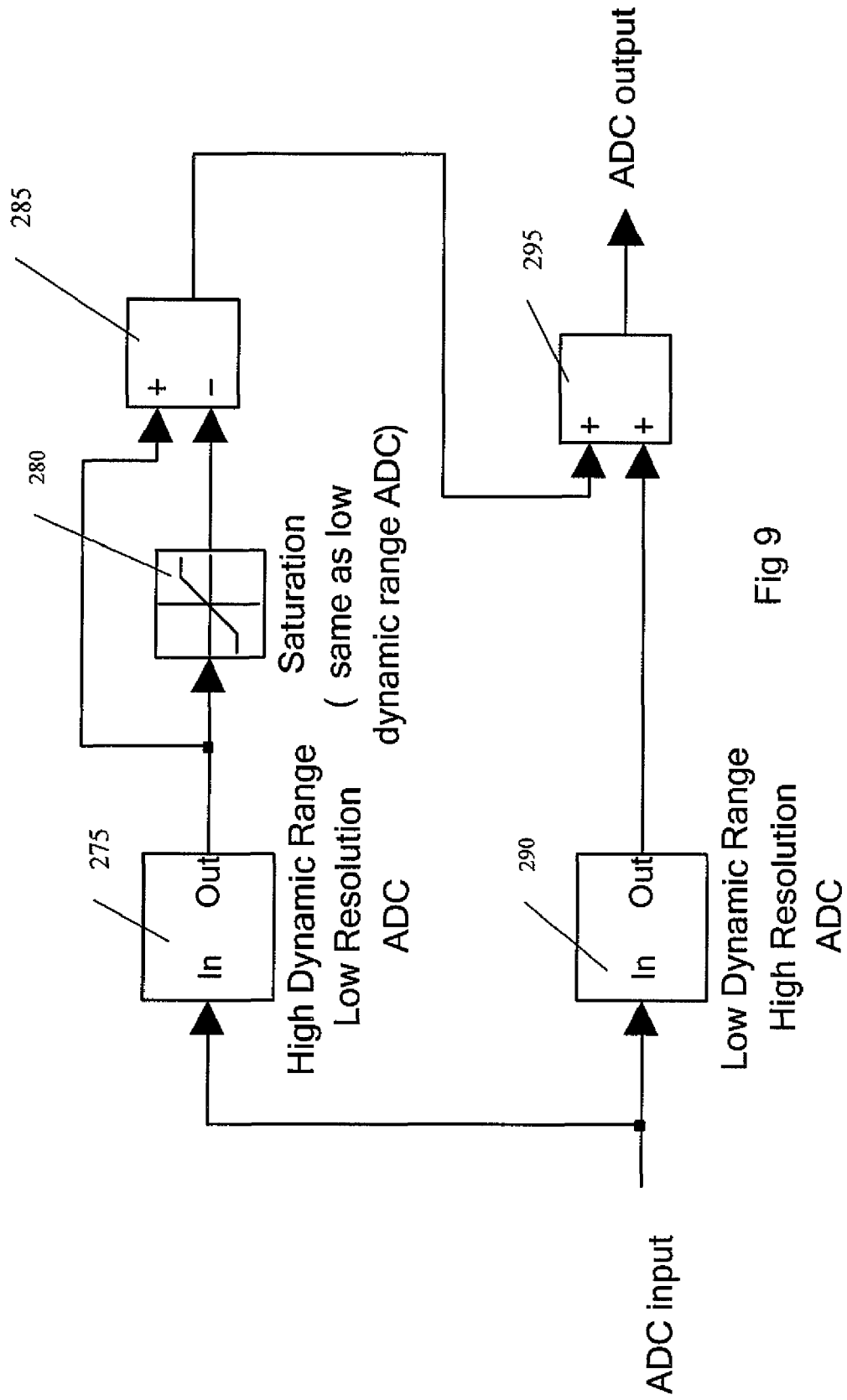
FIG. 9 is a schematic block diagram representation of one implementation of a multiresolution ADC.

This ADC can be simply made out of two or more low bit count, low cost ADCs. This embodiment can be seen in FIG. 9. Referring to FIG. 9, the embodiment shown therein includes a low dynamic range, high resolution ADC 290 and a high dynamic range low resolution ADC 275; the low dynamic range high resolution ADC 290 and said high dynamic range low resolution ADC 275 having a same input. A saturation component 280, having a same dynamic range as said low dynamic range, high resolution ADC 290, receives an output of the high low dynamic range, low resolution ADC 275 and a subtraction component 285 provides a difference between an output of the high dynamic range low resolution ADC 275 and an output of the saturation component 280. An addition component to 95 receives an output of the subtraction component 285 and an output of the low dynamic range high resolution ADC 290; an output of the addition component 295 is an output of the multiresolution ADC.

Predictive Duty Cycle Current Limit

Figure 10:
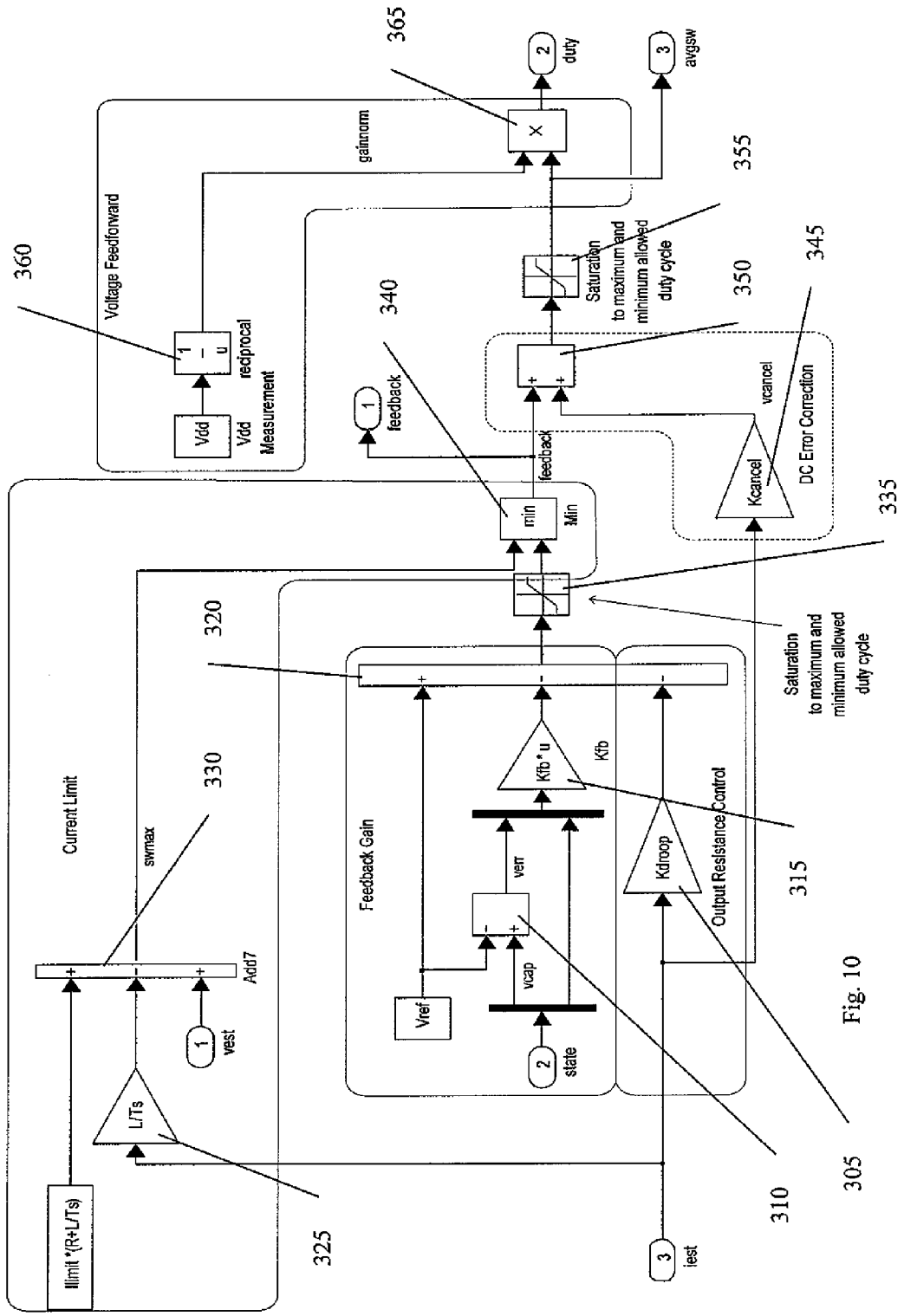
FIG. 10 is a schematic block that a representation of one embodiment of a component of the system of these teachings.

Current limit is implemented by calculating the maximum duty cycle that can be allowed such that the predicted average for the next control cycle is less than or equal to maximum allowed current. The equations for the maximum allowed next duty cycle is:

$$swmax(n+1)=vest(n)+ILmit(R+L/Ts)-(L/Ts)iest(n)$$

where:
swmax is the maximum allowed next average switch voltage
vest is the estimated or measured output voltage
ILmit is the maximum allowed average inductor current
L is the power stage inductance
R is the power stage total resistance
Ts is the sample rate
iest is the average inductor current estimate An embodiment of a system providing current limit can be seen in FIG. 10.

The controlled output resistance is achieved by Kdroop. This gain subtracts (or adds) from the normal, feedback control to make the DC resistance the desired value. For example, if the feedback states are the output capacitor voltage (vcap) and the output capacitor current (icap), the output resistance is just:

$$Rout=Kdroop/Kfb_1$$

where Kfb is the state feedback gain matrix. $Kfb_2$ and Kdroop are the current feedback terms and they control the feedback loop damping.

Power Electronics Resistance Canceller

Instead of requiring integral control to minimize error, the DC error correction provides for the extra duty cycle needed to remove the power stage voltage drop. This is done by setting Kcancel equal to the total power stage resistance.

With fixed average current estimator $$Kcancel=R$$

With adaptive average current estimator $$Kcancel=(1-Aest(n))/Best(n)$$

Final duty cycle calculation for the case when the states are vcap & icap and the duty cycle is not saturated by either the current limit or the duty cycle saturations.

$$duty(n+1)=(Kfb_1(vcap(n)-Vref)-Kfb_2icap(n)-(Kdroop+Kcancel)iest(n))/Vdd$$

where:
Vdd is the power stage input voltage
Vref is the desired output voltage
Kfb, Kdroop, Kcancel are gains
vcap and icap are states
iest is estimation inductor current
duty is the duty cycle (fractional)

An embodiment of the duty cycle determination system is shown in FIG. 10. Referring to FIG. 10, the embodiment shown therein includes a first multiplier 305 receiving and inductor current estimate and multiplying the inductor current estimate by a first gain (Kdroop), a subtraction component 310 receiving a capacitor voltage, which is one state in a state vector, and a predetermined voltage reference value and providing a difference between the capacitor voltage and the predetermined voltage reference value, a second multiplier 315 receiving state vector elements other than capacitor voltage and an output of said another subtraction component and multiplying said received state vector elements and said output of said another subtraction component by a second gain vector (Kfb) and a first combining component 320 receiving an output of the first multiplier 305 and an output of the second multiplier 315; the first combining component 320 providing a negative of a sum of the output of the first multiplier 305 and the output of the second multiplier 315. In the embodiment shown in FIG. 10, the components implementing the effect of the current limit on the duty cycle (and on the average switch voltage) include a third multiplier 325 receiving the inductor current estimate and multiplying the inductor current estimate by a power stage inductance divided by a sample rate and a second combining component 330 receiving an output of the third multiplier 325, a measurer/estimated output voltage and a product of a maximum allowed average inductor current (also referred to as the current limit) times a sum of a power stage total resistance and the power stage inductance divided by the sample rate. The second combining component 330 provides a difference between a sum of the output of the third multiplier 325 and the measures/estimated output voltage and the product of the current limit times the sum of the power stage total resistance and the power stage inductance divided by the sample rate; an output of the second combining component 330 being a maximum allowed average switched voltage at a next sampling time.

The embodiment shown in FIG. 10 also includes a first saturation component 335 receiving an output of the first combining component 320, the first saturation component 335 restricting the output of the first combining component 320 and a minimum selecting component 340 receiving an output of the first saturation component 335 and the output of the second combining component 330, the minimum selecting component 340 providing a smallest of the output of the first saturation component 335 and the output of the second combining component 330.

In the embodiment shown in FIG. 10, the DC error correction is implemented by a fourth multiplier 345 receiving the inductor current estimate and multiplying the inductor current estimate by a fourth gain (Kcancel) and another addition component 350 receiving an output of the minimum selecting component 340 and an output of the fourth multiplier 345 and providing a sum of the output of the minimum selecting component 340 and the output of the fourth multiplier 345. The sum of the output of the minimum selecting component 340 and the output of the fourth multiplier 345 is provided to a second saturation component 355, the output of the second saturation component being the average switch voltage. A reciprocal component 360 receives a power stage input voltage and provides an inverse of the power stage input voltage as output. A multiplying component 365 multiplies an output of the reciprocal component 360 and an output of second saturation component 355, an output of the multiplying component 365 being the duty cycle. If the first and second saturation components 335, 355 and the minimum selecting component 340 are omitted from FIG. 10, the resulting figure shows and embodiment that provides a duty cycle determination according to the equation hereinabove. The feedback signal utilized in the state estimation is obtained from the output of the minimum selecting component 340.

Complete Digital Compensator

Figure 11:
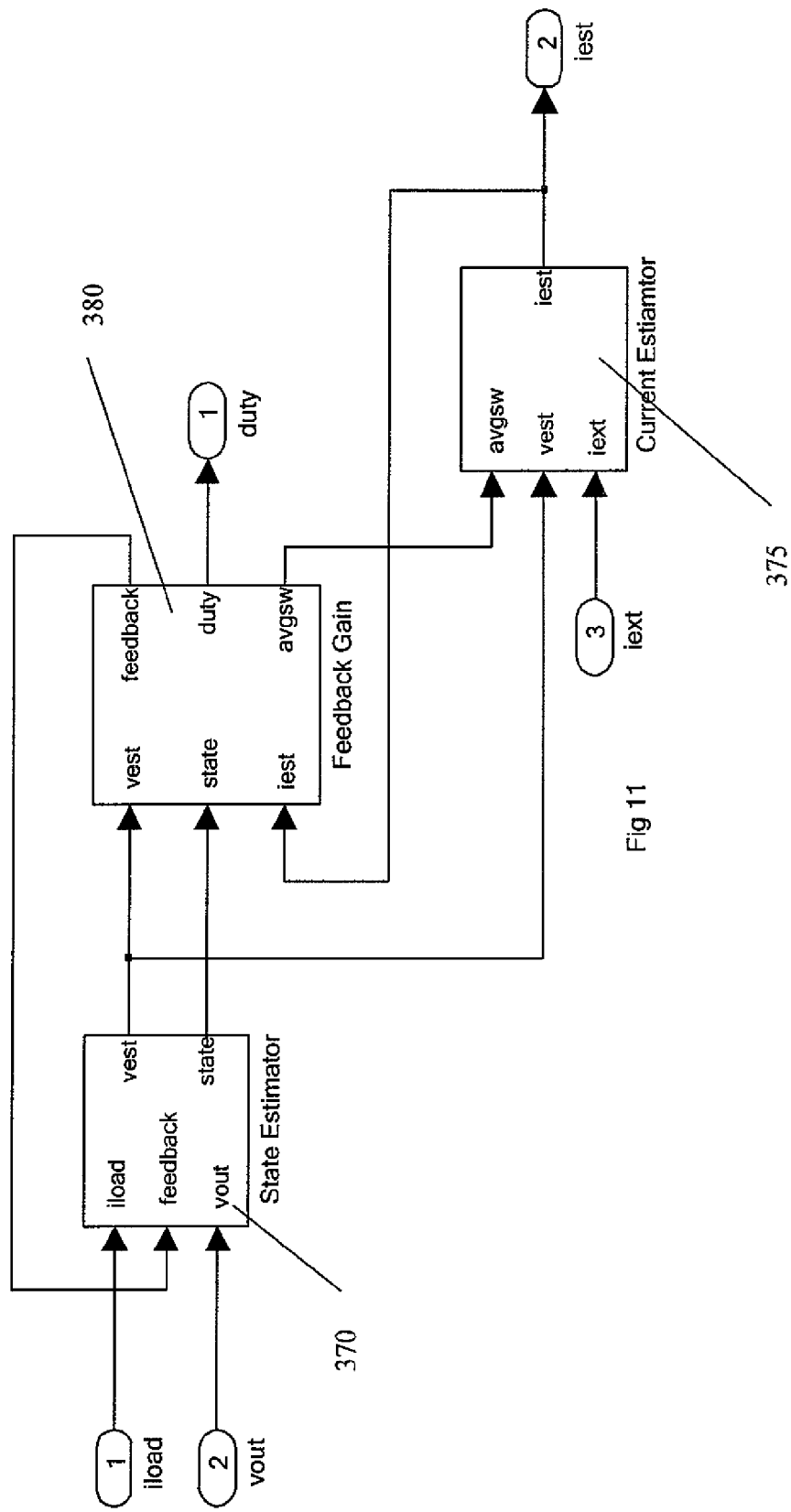
FIG. 11 is a schematic block diagram representation of and embodiment of the digital compensator of these teachings.

An embodiment of the complete digital compensator in shown in FIG. 11. Referring to FIG. 11, a state estimator component 370 receives as inputs load current values and output voltage values and a feedback signal (obtained from a duty cycle determination/feedback gain component 380) and provides as output a measured or estimated average output voltage (labeled vest) and state values. A current estimating component 375 receives as inputs a measured inductor voltage (labeled iext), the measured or estimated average output voltage obtained from the state estimator component 370 and an average switch voltage (obtained from the duty cycle determination/feedback gain component 380) and provides as output an average inductor current estimate (labeled Iest). The duty cycle determination/feedback gain component receives as inputs the average output voltage (vest) and the state from the state estimator component 370 and the average inductor current estimate from the current estimating component 375 and provides as output a duty cycle, the feedback signal and the average switch voltage. The duty cycle signal is provided to the PWM (25, FIG. 1).

Examples of Operation

Exemplary embodiments are shown below. It should be noted that these teachings are not limited to the exemplary embodiments.

The simulations were performed using Matlab/Simulink with a complete model of a closed loop single phase buck converter.

Figure 12:
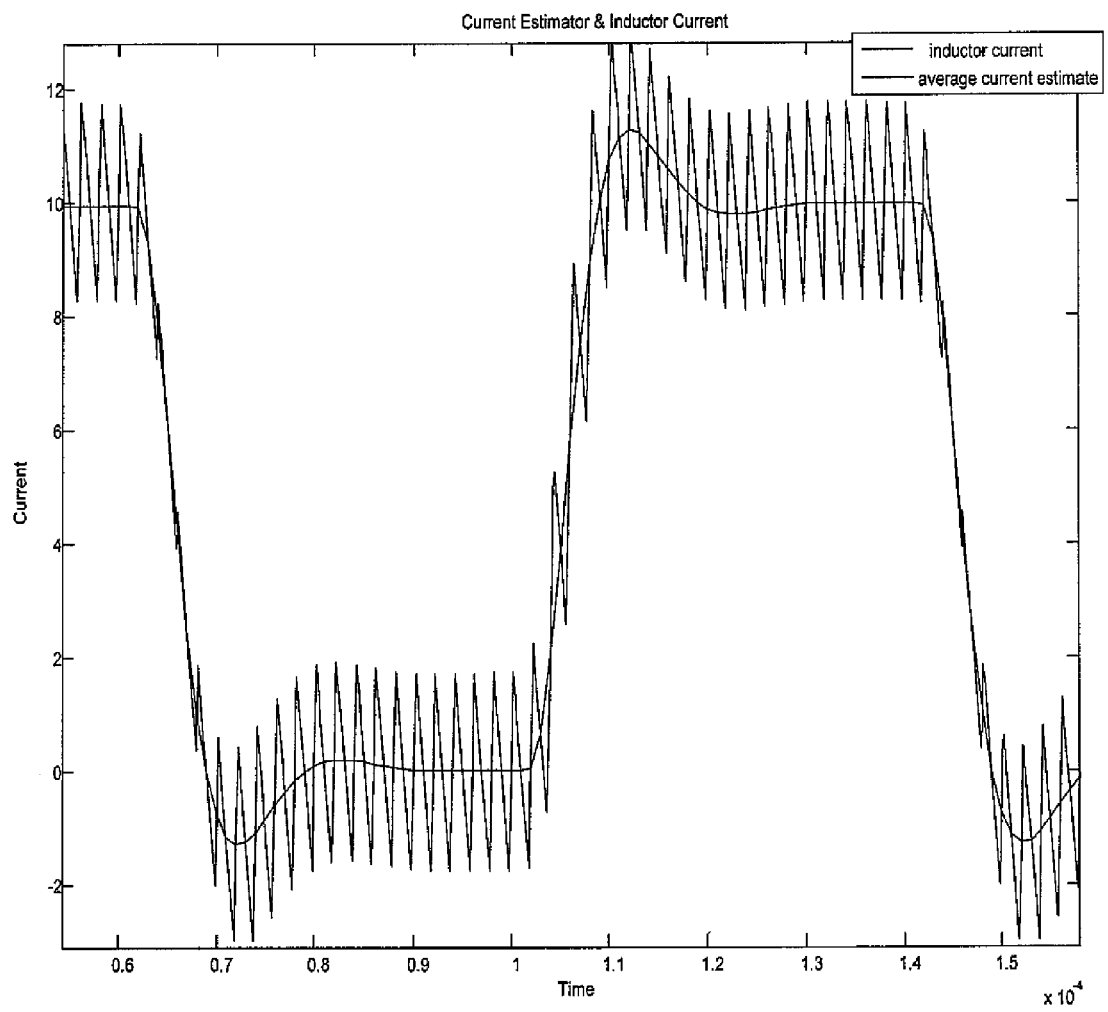
FIGS. 12-18 are schematic graphical representations of exemplary results of an embodiment of the system of these teachings.
Figure 13:
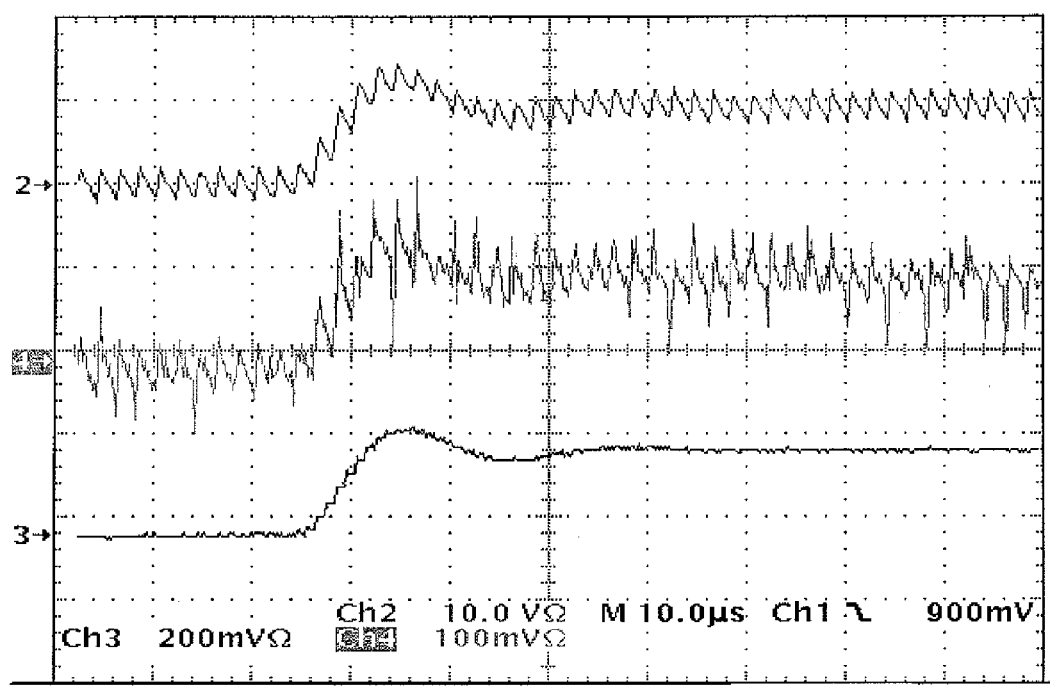

FIGS. 12 and 13 shows an exemplary embodiment of the average current estimator operating. FIG. 12 is a Matlab/Simulink simulation and FIG. 13 is laboratory measurements made on operating hardware. Note the noise problem with the prior art RC filter inductor measurement method.

Current Limit

Figure 14:
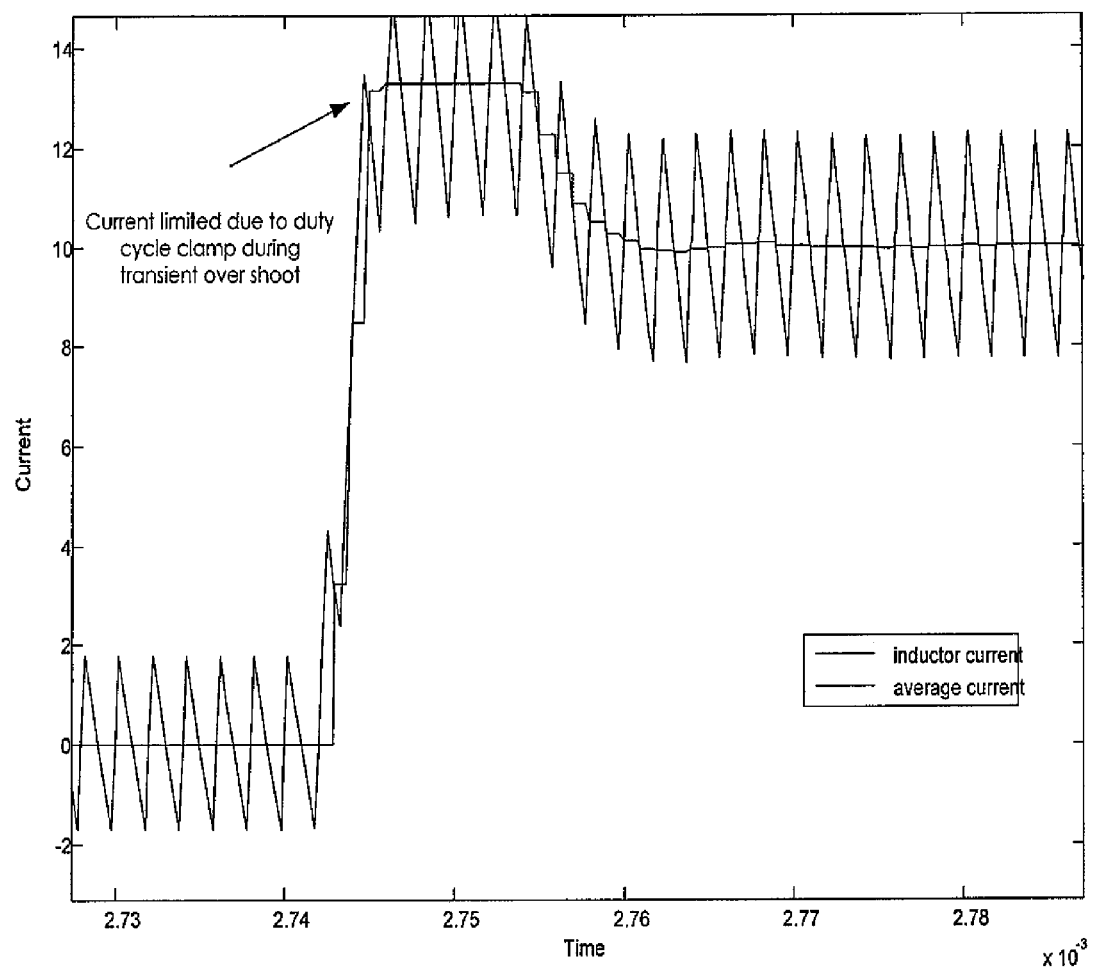

The duty cycle predictive current limit is shown in FIG. 14.

DC Error Canceling

Figure 15:
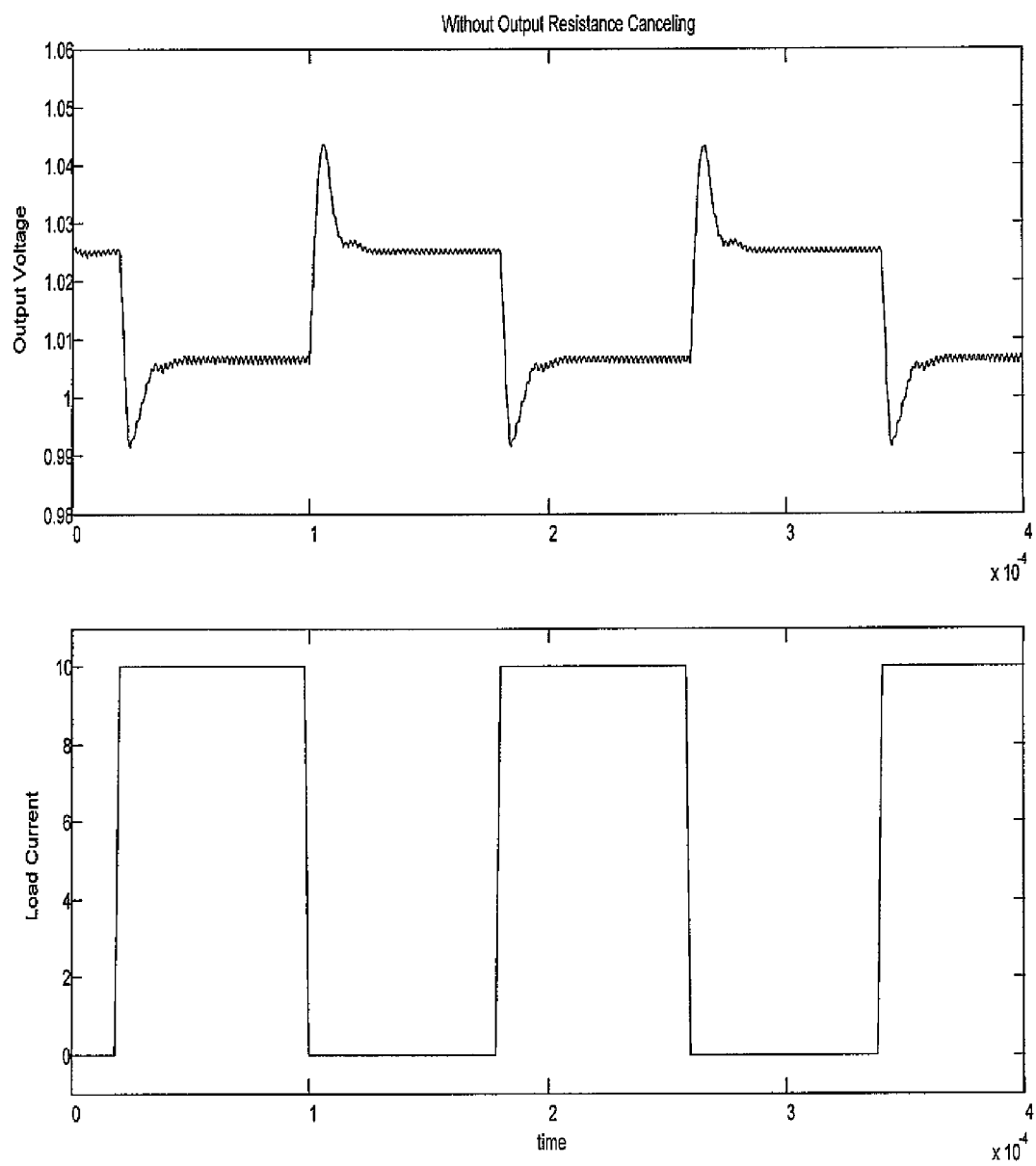
Figure 16:
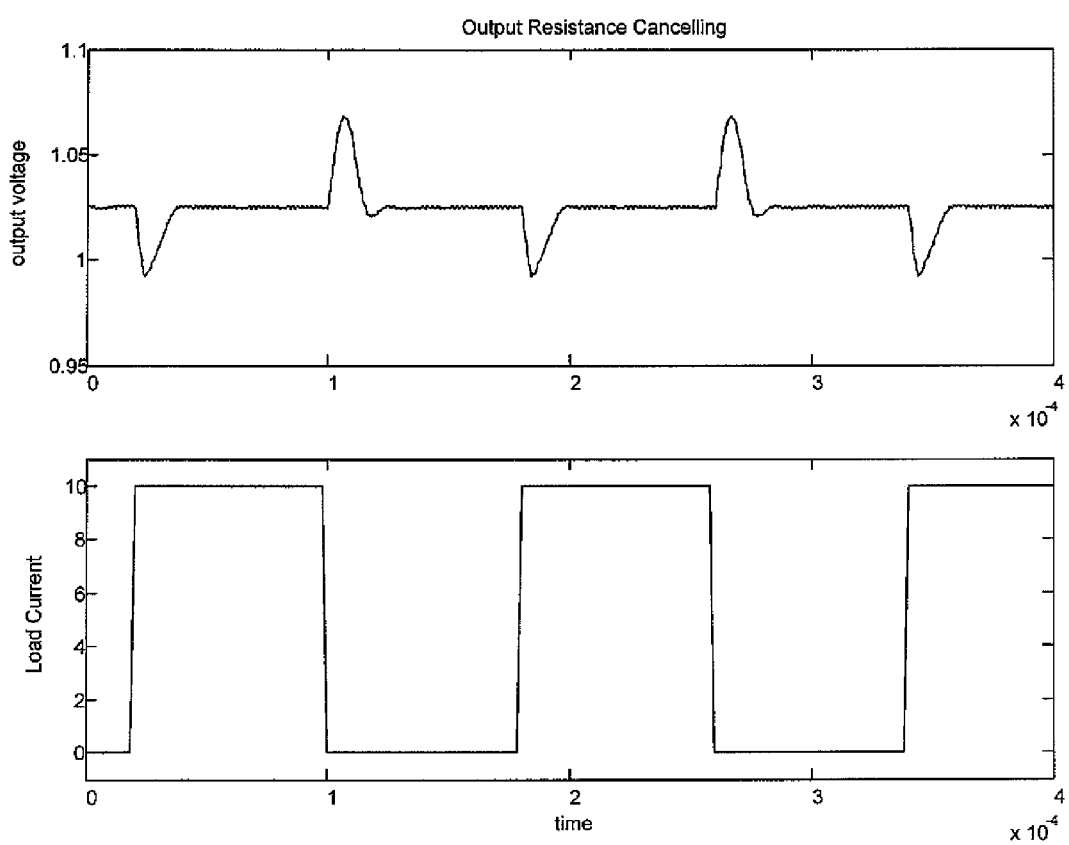

The DC error canceling can be seen in FIGS. 15 and 16. Note the large output voltage error without DC error canceling.

Combined Current Estimator

Figure 17:
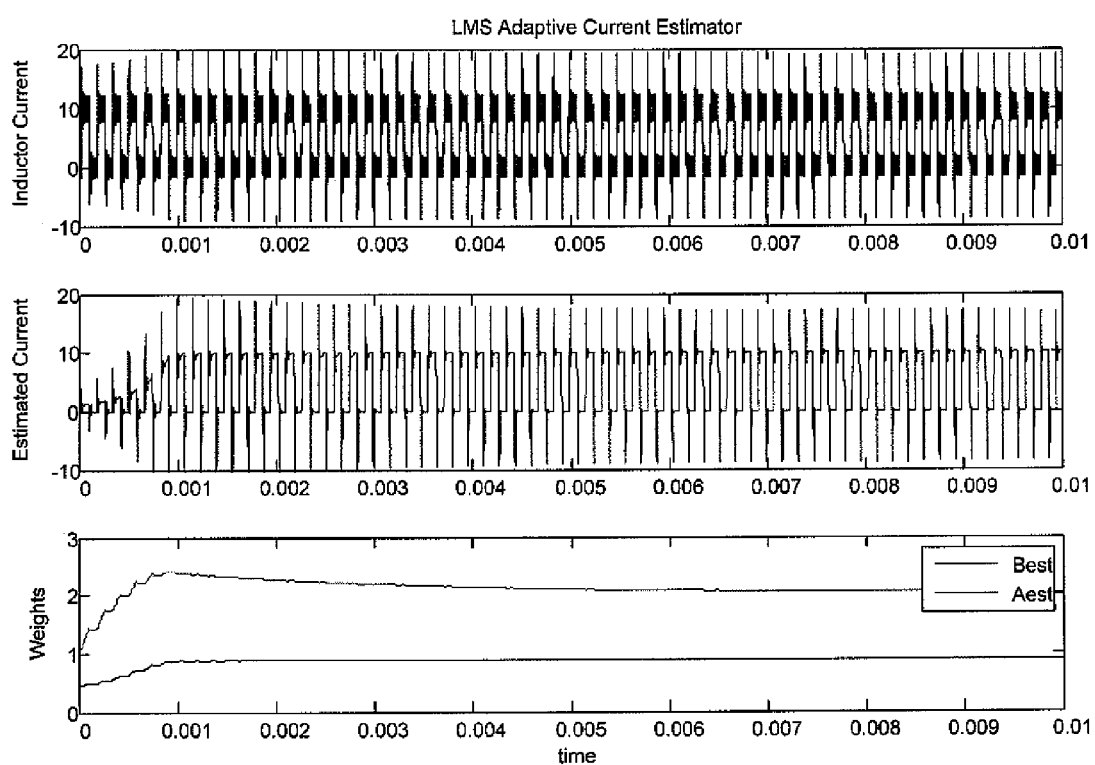

FIG. 17 shows the adaptive current estimator converging.

Figure 18:
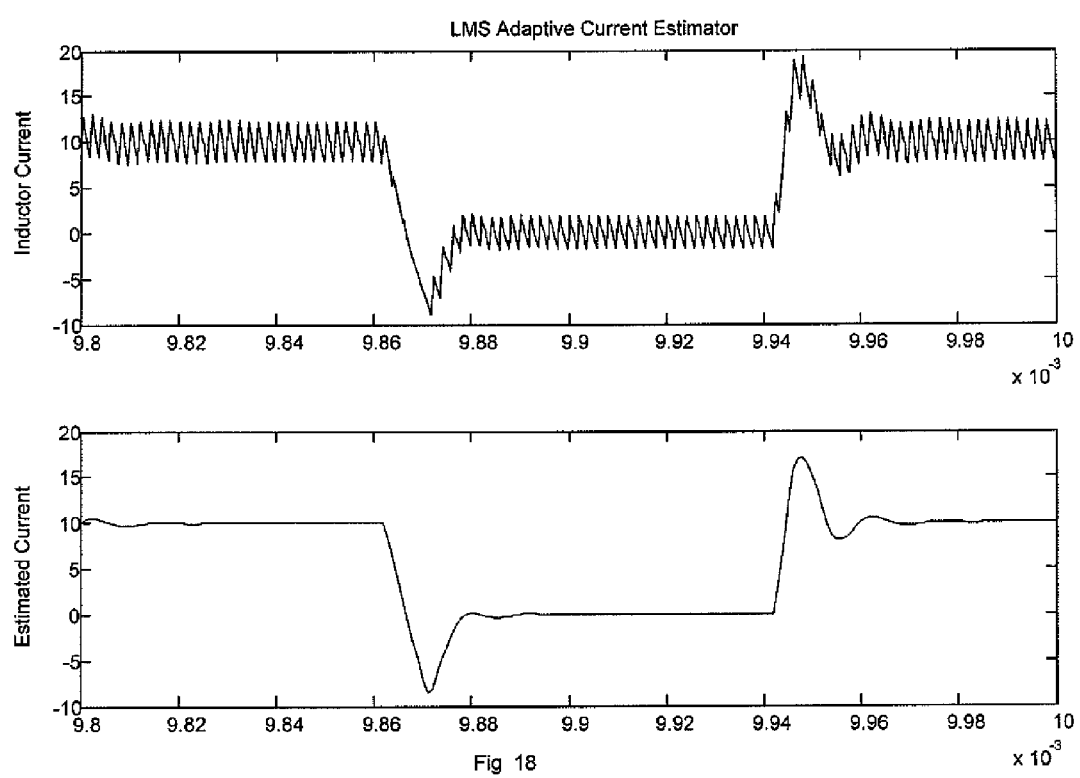

FIG. 18 shows that the adaptive current estimator converged.

Although these teachings has been described with respect to various embodiments, it should be realized these teachings are also capable of a wide variety of further and other embodiments within the spirit and scope of the appended claims.

What is claimed is:

1. An inductor current estimator for a switching power supply, the inductor current estimator comprising:
a first sensing and averaging component that generates an average of a switch voltage at an input to the switching power supply;
a second sensing and averaging component that generates an average of an output voltage of the switching power supply;
a first subtraction component that receives the average of the switch voltage and the average of the output voltage;
a first multiplying component that receives an output of the first subtraction component and that multiplies the output of the first subtraction component by a first model parameter;
a second multiplying component that multiplies an input to the second multiplying component by a second model parameter;
an adding component that adds an output of the first multiplying component and an output of the second multiplying component; and
a delay component that receives an output of the adding component,
wherein an input to the second multiplying component is an output of the delay component.

2. The inductor current estimator of claim 1, wherein the first and second model parameters are obtained by a zero order hold discrete time approximation.

3. The inductor current estimator of claim 1, wherein the switching power supply is a buck regulator, and wherein
the first model parameter is given by T/L;
the second model parameter is given by 1−RT/L;
wherein T is a pulse-width modulation (PWM) cycle time;
L is an inductance; and
R is a power stage DC resistance.

4. The inductor current estimator of claim 1 further comprising:
a low pass filter, wherein in a frequency representation, a pole of the low pass filter is selected to correct aliasing, and wherein the low pass filter receives a measured inductor voltage;
a pole-zero filter that receives a digitized output of the low pass filter, wherein a zero of the pole-zero filter is adjusted to compensate for an external anti-aliasing filter, wherein a pole of the pole-zero filter is adjusted to match an inductor time constant, and wherein an output of the pole-zero filter is multiplied by a predetermined filter gain to provide a measured inductor current;
a comparison component that compares a predicted inductor current and the measured inductor current; and an adjustment component that receives an output of the comparison component and that provides adjusted values for parameters of a discrete time representation of a circuit equation for the inductor current estimator.

5. The inductor current estimator of claim 4 further comprising:
a second subtraction component that receives the average of the switch voltage and the average of the output voltage,
wherein the adjustment component provides adjusted values of the first and second model parameters, and
wherein the predicted inductor current is obtained by a sum of a product of the first model parameter times an output of the second subtraction component plus a product of the second model parameter and a delayed value of a previously predicted inductor current.

6. The inductor current estimator of claim 5 wherein a least-mean-square (LMS) method is utilized in the adjustment component.

7. A state estimator for a switching power supply, the state estimator comprising:
a high dynamic range digital to analog converter (DAC) that receives an estimated output voltage obtained by multiplying an estimated state vector by an output matrix;
an analog subtraction component that subtracts an output of the high dynamic range DAC from a measured output voltage;
an analog to digital converter (ADC) that receives an output of the analog subtraction component;
a first delay component that receives the estimated output voltage;
a first addition component that adds an output of the ADC and an output of the first delay component; and
a first subtraction component that receives an output of the first addition component and the estimated output voltage,
wherein an output of the first subtraction component is a voltage error utilized in obtaining the estimated state vector.

8. The state estimator of claim 7, wherein the ADC is a multiresolution ADC having high resolution in a center of a dynamic range and low resolution away from the center of the dynamic range.

9. The state estimator of claim 8, wherein the multiresolution ADC comprises:
a low dynamic range, high resolution ADC;
a high dynamic range, low resolution ADC, wherein the low dynamic range, high resolution ADC and the high dynamic range, low resolution ADC have a same input;
a saturation component, having a same dynamic range as the low dynamic range, high resolution ADC wherein the saturation component receives an output of the high dynamic range, low resolution ADC;
a second subtraction component that provides a difference between an output of the high dynamic range, low resolution ADC and an output of the saturation component; and
a second addition component that adds an output of the second subtraction component and an output of the low dynamic range, high resolution ADC,
wherein an output of the addition component is an output of the multiresolution ADC.

10. The state estimator of claim 7 further comprising:
a first multiplier that receives the voltage error and that multiplies the voltage error by an output error feedback matrix;
a second multiplier that receives a predetermined or previously obtained feedback signal and that multiplies the feedback signal by an input matrix;
a second delay component;
a third multiplier that receives an output of the second delay component; and
a second addition component that adds outputs of the first, second, and third multipliers,
wherein an output of the second addition component is the estimated state vector.

11. The state estimator of claim 10 further comprising:
a low resolution ADC that receives a load current signal; and
a fourth multiplier that multiplies an output of the low resolution ADC by a feedforward matrix,
wherein an output of the fourth multiplier is received by the second addition component.

12. A duty cycle determination system for a switching power supply, the duty cycle determination system comprising:
a first multiplier that receives an inductor current estimate and that multiplies the inductor current estimate by a first gain;
a subtraction component that receives a capacitor voltage and a predetermined voltage reference value, and that provides a difference between the capacitor voltage and the predetermined voltage reference value;
a second multiplier that receives state vector elements other than capacitor voltage and an output of the subtraction component, and that multiplies the received state vector elements and the output of the subtraction component by a second gain vector;
a first combining component that combines an output of the first multiplier and an output of the second multiplier, and that provides a negative of a sum of the output of the first multiplier and the output of the second multiplier;
a third multiplier that receives the inductor current estimate and that multiplies the inductor current estimate by a third gain;
an addition component adds an output of the first combining component and an output of the third multiplier, and that provides a sum of the output of the first combining component and the output of the third multiplier;
a reciprocal component that receives a power stage input voltage and that provides an inverse of the power stage input voltage as output; and
a fourth multiplier that multiplies an output of the reciprocal component and an output of the addition component,
wherein an output of the fourth multiplier is the duty cycle.

13. The duty cycle determination system of claim 12 further comprising:
a fifth multiplier that receives the inductor current estimate and that multiplies the inductor current estimate by a power stage inductance divided by a sample rate; and
a second combining component that combines an output of the fifth multiplier, an output voltage, and a product of a maximum allowed average inductor current times a sum of a power stage total resistance and the power stage inductance divided by the sample rate and that provides a difference between a sum of the output of a duty cycle determination system multiplier and the output voltage and the product,
wherein an output of the second combining component is a maximum allowed average switched voltage at a next sampling time.

14. The duty cycle determination system of claim 13 further comprising:

a first saturation component that receives an output of the first combining component, wherein the first saturation component restricts an output of the first combining component; and a minimum selecting component that receives an output of the first saturation component and the output of the second combining component and that provides a smallest of the output of the first saturation component and the output of the second combining component, wherein the addition component receives an output of the minimum selecting component and an output of the third multiplier, wherein a second saturation component receives an output of the addition component, wherein the second saturation component restricts the output of the addition component, and wherein the fourth multiplier multiplies the output of the reciprocal component and an output of the second saturation component.

15. A method for estimating inductor current in a switching power supply, the method comprising:

using a processor:
    obtaining an average of a switch voltage at an input to the switching power supply;
    obtaining an average of an output voltage of the switching power supply;
    obtaining a difference between the average of the switch voltage and the average of the output voltage;
    multiplying the difference by a first model parameter to obtain a first product;
    multiplying a delayed value of a previously estimated inductor current by a second model parameter to obtain a second product;
    adding the first product and the second product to obtain a sum; and
    obtaining an estimated inductor current from the sum.

16. The method of claim 15 further comprising:

using the processor:
    measuring an inductor voltage;
    providing a pole-zero for a pole-zero filter;
    selecting a zero of the pole-zero filter being to compensate for an external anti-aliasing filter;
    selecting a pole of the pole-zero filter to substantially match an inductor time constant;
    filtering the measured inductor voltage with the pole-zero filter;
    multiplying an output of the pole-zero filter by a predetermined filter gain, to obtain a measured inductor current;
    comparing the estimated inductor current and the measured inductor current;
    adjusting, based on the comparison, the first and second model parameters; and
    obtaining a subsequent value of estimated inductor current utilizing the adjusted first and second model parameter.

17. A method for measuring inductor current in a switching power supply, the method comprising the steps of:

using a processor:
    measuring an inductor voltage;
    providing a pole-zero for a pole-zero filter;
    selecting a zero of the pole-zero filter to compensate for an external anti-aliasing filter;
    selecting a pole of the pole-zero filter to match an inductor time constant;
    filtering the measured inductor voltage with the pole-zero filter; and
    multiplying an output of the pole-zero filter by a predetermined filter gain.

\* \* \* \* \*

UNITED STATES PATENT AND TRADEMARK OFFICE
CERTIFICATE OF CORRECTION

PATENT NO. : 8,285,502 B2  
APPLICATION NO. : 12/622478  
DATED : October 9, 2012  
INVENTOR(S) : Stewart Kenly et al.

Page 1 of 1

It is certified that error appears in the above-identified patent and that said Letters Patent is hereby corrected as shown below:

| | |
|---|---|
| Title Page, Column 2, Other Publications, Line 1 | Delete "G.M." and insert --G. M.,-- |
| Title Page 2, Column 2, Other Publications, Line 12 | Delete "S.R." and insert --S. R.,-- |
| Title Page 2, Column 2, Other Publications, Line 15 | Delete "al." and insert --al.,-- |

In the Drawings:  
Sheet 13 of 20, Reference Numeral 375, Line 1, Fig. 11 — Delete "Estiamtor" and insert --Estimator--

In the Specifications:

| | |
|---|---|
| Column 1, Line 16 | Delete "relates" and insert --relate-- |
| Column 2, Line 49 | After "that", insert --is-- |
| Column 2, Line 51 | Delete "and" and insert --an-- |
| Column 3, Line 1 | Delete "are" and insert --or-- |
| Column 5, Line 54 | After "utilized", insert --in-- |
| Column 7, Line 43 | Delete "to 95" and insert --295-- |
| Column 7, Line 67 | Delete "normal," and insert --normal-- |
| Column 8, Line 36 | Delete "and" and insert --an-- |
| Column 9, Line 33 | Delete "and" and insert --an-- |
| Column 9, Line 38 | Delete "in" and insert --is-- |
| Column 9, Line 50 | Delete "lest" and insert --iest-- |
| Column 10, Line 14 | After "realized", insert --that-- |

In the Claims:

| | |
|---|---|
| Column 11, Line 52, Claim 9 | After "ADC", insert --,-- |
| Column 12, Line 40, Claim 12 | After "component", insert --that-- |

Signed and Sealed this  
Thirteenth Day of August, 2013

Teresa Stanek Rea  
*Acting Director of the United States Patent and Trademark Office*